United States Patent
Galehr et al.

(10) Patent No.: US 11,945,500 B2
(45) Date of Patent: Apr. 2, 2024

(54) ELECTRONIC PRINTED CIRCUIT BOARD

(71) Applicants: thyssenkrupp Presta AG, Eschen (LI); thyssenkrupp AG, Essen (DE)

(72) Inventors: Robert Galehr, Schaanwald (LI); Gergely Racz, Budapest (HU); Sedat Sen, Heerbrugg (CH)

(73) Assignees: thyssenkrupp Presta AG, Eschen (LI); thyssenkrupp AG, Essen (DE)

( * ) Notice: Subject to any disclaimer, the term of this patent is extended or adjusted under 35 U.S.C. 154(b) by 171 days.

(21) Appl. No.: 17/299,567

(22) PCT Filed: Dec. 10, 2019

(86) PCT No.: PCT/EP2019/084426
§ 371 (c)(1),
(2) Date: Jun. 3, 2021

(87) PCT Pub. No.: WO2020/120476
PCT Pub. Date: Jun. 18, 2020

(65) Prior Publication Data
US 2022/0033001 A1    Feb. 3, 2022

(30) Foreign Application Priority Data
Dec. 13, 2018   (DE) ..................... 10 2018 132 098.1

(51) Int. Cl.
*B62D 15/02* (2006.01)
*F16H 55/17* (2006.01)
*H05K 1/02* (2006.01)

(52) U.S. Cl.
CPC ....... *B62D 15/0215* (2013.01); *H05K 1/0266* (2013.01); *F16H 55/17* (2013.01);
(Continued)

(58) Field of Classification Search
CPC ............. B62D 15/0215; H05K 1/0266; H05K 2201/09027; H05K 2201/09145;
(Continued)

(56) References Cited

U.S. PATENT DOCUMENTS 4,734,825 A * 3/1988 Peterson ............. H01L 25/0657
                                                    361/792
4,928,061 A    5/1990 Dampier
(Continued)

FOREIGN PATENT DOCUMENTS

DE         28 25 191 A    1/1979
DE    10 2005 050 016 A   4/2007
(Continued)

OTHER PUBLICATIONS

English Translation of International Search Report issued in PCT/EP2019/084426, dated Mar. 13, 2020.
(Continued)

*Primary Examiner* — Farhana A Hoque
(74) *Attorney, Agent, or Firm* — thyssenkrupp North America, LLC

(57) ABSTRACT

A printed circuit board may include a top side, a bottom side, and a circumferential surface that connects the top side to the bottom side. The circumferential surface may have a toothing for forming a gear wheel. The toothing may be circumferentially closed and may be arranged over an entire surface area of the circumferential surface. The toothing may be configured as an involute toothing, an epicycloid toothing, a hypocycloid toothing, or a lantern gear toothing. The printed circuit board may be formed of fiber-reinforced plastic. Further, the printed circuit board may include a track, a surface structure, and/or a conductor track configured for inductive sampling, capacitive sampling, optical sampling, and/or acoustic sampling.

18 Claims, 3 Drawing Sheets

(52) U.S. Cl.
CPC .............. *H05K 2201/09027* (2013.01); *H05K 2201/09145* (2013.01); *H05K 2201/10151* (2013.01)

(58) Field of Classification Search
CPC .. H05K 2201/10151; H05K 1/02; H05K 1/16; H05K 2201/09045; F16H 55/17
See application file for complete search history.

(56) References Cited

U.S. PATENT DOCUMENTS

| | | | |
|---|---|---|---|
| 5,141,800 | A | 8/1992 | Effenberger |
| 6,111,378 | A | 8/2000 | Lemay |
| 10,254,499 | B1 * | 4/2019 | Cohen .................... H01R 4/024 |
| 2002/0153419 | A1 | 10/2002 | Hall |
| 2004/0010914 | A1 * | 1/2004 | Saysette-Rasmussen ................... B23P 13/02 29/893.35 |
| 2009/0091314 | A1 * | 4/2009 | Karenowska ............ G01D 5/20 324/207.16 |
| 2011/0043198 | A1 | 2/2011 | Ruetz |
| 2015/0083061 | A1 * | 3/2015 | Muller .................... F01L 1/352 123/90.15 |
| 2015/0165444 | A1 | 6/2015 | Tso |
| 2016/0236707 | A1 | 8/2016 | Oberle |
| 2017/0029067 | A1 * | 2/2017 | Schmitz .................. F16D 41/30 |

FOREIGN PATENT DOCUMENTS

| | | |
|---|---|---|
| DE | 10 2008 011 448 A | 9/2009 |
| DE | 20 2008 018 076 U | 8/2011 |
| DE | 10 2014 220 465 A | 4/2016 |
| DE | 102015202732 A | 8/2016 |
| EP | 1 607 720 A | 12/2005 |
| EP | 2 270 433 B | 8/2014 |
| EP | 3190384 A | 7/2017 |
| EP | 2 247 925 B | 5/2018 |
| WO | 2009/106227 A | 9/2009 |

OTHER PUBLICATIONS

POSIC, IDC1102C Dual Channel Rotary Encoder Kit (Product Data), pp. 1-4, (2017).

* cited by examiner

ELECTRONIC PRINTED CIRCUIT BOARD

CROSS REFERENCE TO RELATED APPLICATIONS

This application is a U.S. National Stage Entry of International Patent Application Serial Number PCT/EP2019/084426, filed Dec. 10, 2019, which claims priority to German Patent Application No. DE 10 2018 132 098.1, filed Dec. 13, 2018, the entire contents of both of which are incorporated herein by reference.

FIELD

The present disclosure generally relates to printed circuit boards, including methods for producing printed circuit boards.

BACKGROUND

A printed circuit board is a carrier for electronic components. It serves to mechanically fasten and to mechanically connect electronic components. Printed circuit boards consist of electrically insulating material, in particular fiber-reinforced plastic with conductive connections, the so-called conductor tracks, adhering to said material.

Laid-open specification EP 2 247 925 A1 discloses printed circuit boards which are part of a steering angle sensor arrangement. In this case, a printed circuit board is connected to a gear wheel which rolls on a second gear wheel in order to thereby determine a steering angle of a shaft.

Specification DE 10 2008 011 448 A1 discloses a steering shaft, the rotation of which is sampled with two gear wheel mechanisms, wherein a first gear wheel mechanism is a hypocycloid gear mechanism which is connected to a printed circuit board and with which an absolute angular value can be determined over several passes. In order to improve the angular resolution, a second gear wheel mechanism is used which transmits a large number of rotations to a satellite for each revolution of the steering shaft, so that an accurate angle can be determined. Combination of the two sampled angular signals makes it possible to determine the absolute angle. The proposed solution proves disadvantageous in that a large number of components and therefore a large amount of installation space are required.

Thus, a need exists for a printed circuit board which allows a simple and improved sensor unit.

DETAILED DESCRIPTION

Figure 1:
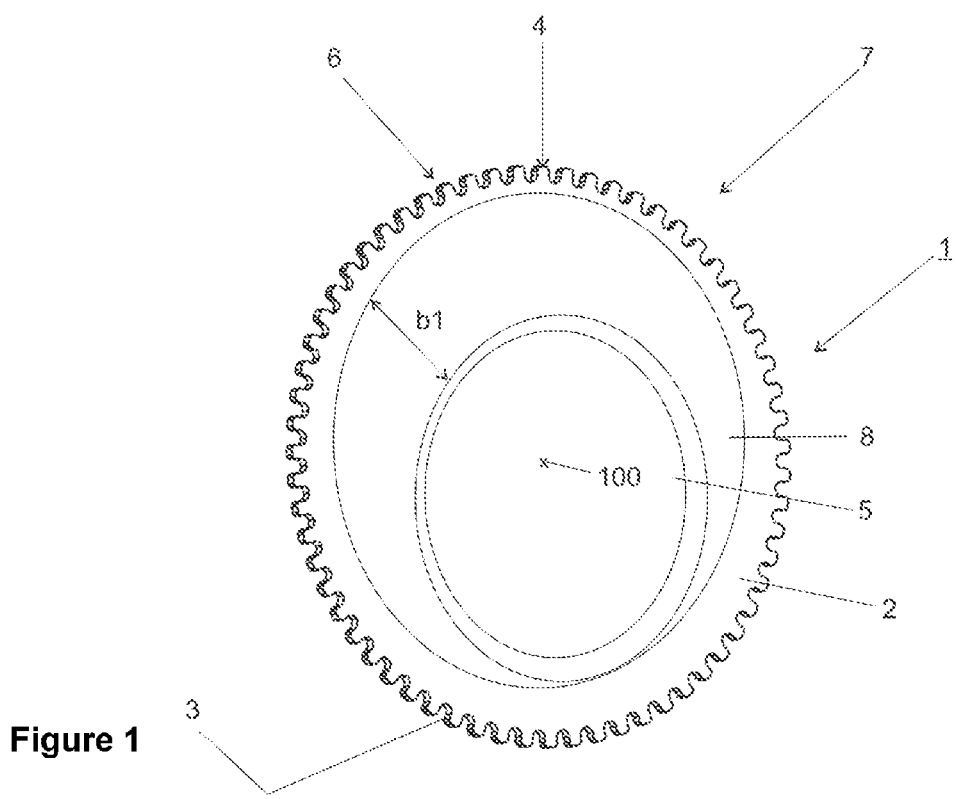
FIG. 1 is a perspective view of an example printed circuit board.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting "a" element or "an" element in the appended claims does not restrict those claims to articles, apparatuses, systems, methods, or the like having only one of that element, even where other elements in the same claim or different claims are preceded by "at least one" or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

Accordingly, a printed circuit board having a top side, a bottom side and a circumferential surface which connects the top side to the bottom side, wherein the circumferential surface has a toothing for forming a gear wheel, is provided.

The printed circuit board with the toothing therefore directly forms the gear wheel. Since the toothing is formed in one piece with the printed circuit board, components and/or further processing steps can be saved.

The toothing is preferably circumferentially closed and formed over the entire surface area of the circumferential surface. The toothing can be formed on the outer circumferential surface or the inner circumferential surface. The printed circuit board is preferably circular.

The toothing is preferably designed as an involute, epicycloid or hypocycloid toothing or as a lantern gear toothing. The toothing can be configured in an axially parallel or oblique manner or as an arcuate toothing. Furthermore, it is conceivable and possible for the teeth to be designed as a Maltese cross.

In an advantageous embodiment, the printed circuit board carries a track and/or a surface structure and/or a conductor track which are/is designed for inductive and/or capacitive and/or optical and/or acoustic sampling. The tracks and/or the surface structure are preferably formed from copper. Furthermore, it is conceivable and possible for said track and/or surface structure to be formed from aluminum, silver, tin, nickel and/or gold. The track is preferably circular and in each case has a width in the radial direction, in the plane of the top/bottom side of the gear wheels, which increases uniformly along the periphery of the circle over a first semicircle and decreases uniformly again over the second semicircle. The rate of increase and decrease of the width is in each case continuous and constant over the entire periphery in this case.

The printed circuit board is a carrier for electronic components. The printed circuit board preferably has at least one of the following components: at least one electrical resistor, at least one capacitor, at least one diode and/or at least one transistor.

The printed circuit board is advantageously produced from fiber-reinforced plastic.

Provision may be made for the gear wheel and/or the toothing to have an abovementioned surface structure.

The track and or the surface structure can be formed by projections and recesses.

It is preferred when the printed circuit board or the toothing is provided with a coating which contains at least $MoS_2$, PTFE, graphite or UHMWPE. It is conceivable and possible for the coating to be formed as a lacquer.

Furthermore, a sensor unit having at least one above-described printed circuit board is provided. The sensor unit is preferably provided for measuring a rotation state of a shaft, wherein it preferably has a gear mechanism which is connected to the shaft, wherein the gear mechanism has at least two gear mechanism elements which engage with one another by means of a toothing and wherein at least one of the at least two gear mechanism elements is a gear wheel, the rotation of which about a rotation axis is detected by the sensor unit, and wherein the at least one gear wheel and the toothing of the at least one gear wheel are formed by an above-described printed circuit board. The gear mechanism can be designed as a spur gear mechanism, wherein one of the gear mechanism elements comprises an external toothing and the other gear mechanism element comprises an internal toothing, wherein the externally toothed gear mechanism element engages into the internally toothed gear mechanism element. Furthermore, the two gear mechanism elements can be designed as an external toothing by means of which the two gear mechanism elements are operatively connected to one another. A gear wheel mechanism, a crown gear mechanism, a worm gear mechanism, a star gear mechanism or an elliptical gear mechanism can be realized in this way. If the gear mechanism is designed as a gear wheel mechanism, the first gear wheel preferably has at least 3 times more teeth than the second gear wheel, further preferably 4 times more teeth than the second gear wheel. The toothing of the two gear wheels is formed on the corresponding printed circuit board. The two gear wheels are therefore in contact by means of the printed circuit boards. It is furthermore conceivable and possible to design the sensor unit in a linear manner in the form of a rack-and-pinion gear mechanism in which a gear wheel formed as a printed circuit board rolls on a toothing of a rack and pinion and therefore the rotation of the rack and pinion can be converted into a linear movement of the rack and pinion and vice versa. The sensor unit advantageously comprises at least one coil which can be assigned to the at least one printed circuit board and which samples the track and/or the surface structure. The at least one coil is preferably part of a resonant circuit and generates a radiofrequency magnetic field. The sensor unit can be designed as a motor vehicle sensor unit or corresponding motor vehicle steering system sensor unit.

In addition, a method for producing an abovementioned printed circuit board having a top side, a bottom side and a circumferential surface which connects the top side to the bottom side is provided, wherein the method comprises the following step:

forming a toothing on the circumferential surface of the printed circuit board by means of milling, punching or laser cutting.

In this case, it is preferred when the toothing is circumferentially closed and formed over the entire surface area of the circumferential surface. The toothing can be arranged on the inner or outer circumferential surface.

The toothing is preferably designed as an involute, epicycloid or hypocycloid toothing or as a lantern gear toothing, in particular as a Maltese cross.

Figure 8:
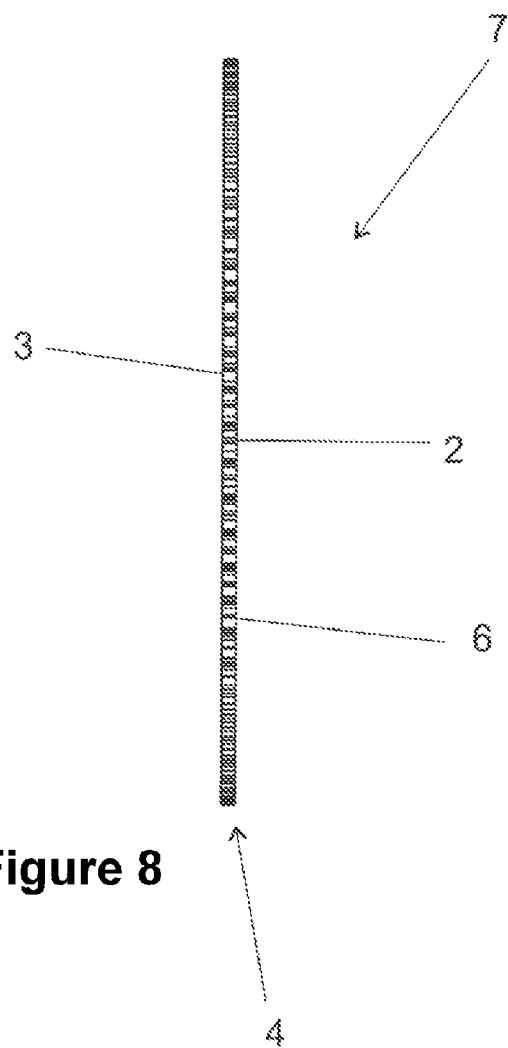
FIG. 8 is a side view of the printed circuit board from FIG. 1.

FIGS. 1 and 8 show a printed circuit board 1 which is part of a sensor unit. The printed circuit board 1 has a top side 2, a bottom side 3 and a circumferential surface 4, wherein the circumferential surface 4 connects the top side 2 to the bottom side 3. The circumferential surface 4 lies on the outer side and forms an outer circumferential surface. The printed circuit board 1 is of circular design. It has a decentralized circular opening 5. The outer circumferential surface 4 has, over the entire periphery, a toothing 6 for forming a gear wheel 7. The external toothing 6 of the printed circuit board 1 is realized by means of milling, punching laser cutting or ultrasonic cutting. A track 8 is applied on the surface of the top and/or bottom side 2, 3 of the printed circuit board 1. The track 8 is inherently closed and does not have a start or an end. The pattern or the surface structure of the track 8 is not of concentric design in relation to a rotation axis 100 of the gear wheel 7. The track 8 is circular and has a width b1 in the radial direction, in the plane of the top side 2 of the printed circuit board 1, which increases uniformly along the periphery of the circle over a first semicircle and decreases uniformly again over the second semicircle. The rate of increase and decrease of the width b1 is in each case continuous and constant over the entire periphery in this case. The center point of the circle of the track 8 does not lie on the rotation axis 100 of the gear wheel 7. The track 8 or the surface structure are preferably formed from copper. Furthermore, it is conceivable and possible for said track and/or surface structure to be formed from aluminum, silver, tin, nickel and/or gold. The track 8 and/or the surface structure are/is inductively, capacitively, optically or acoustically sampled.

The printed circuit board 1 furthermore has at least one of the following components: at least one electrical resistor, at least one capacitor, at least one diode and/or at least one transistor. The track 8, a surface structure and/or a conductor track are/is applied on the printed circuit board 1. The printed circuit board 1 preferably consists of fiber-reinforced plastic.

Figure 2:
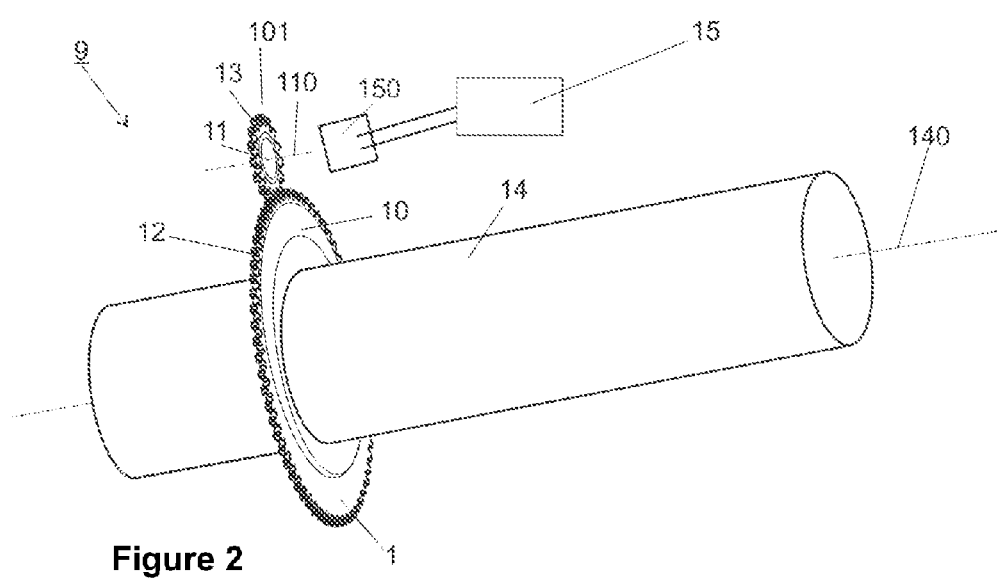
FIG. 2 is a schematic view of an example sensor unit.

FIG. 2 schematically shows a sensor unit 9 which comprises two gear wheels 10, 11. The gear wheels 10, 11 form, with their outer toothing 12, 13, the printed circuit boards 1, 101. A first gear wheel 10 is connected in a rotationally fixed manner to a shaft 14, in particular the steering shaft of a motor vehicle, and concentrically surrounds it. The first gear wheel 10 has an externally directed toothing 12 which is arranged concentrically in relation to the shaft axis 140. This first toothing 12 of the first gear wheel 10 engages into a second encircling outwardly directed toothing 13 of a second gear wheel 11 which rolls on the first gear wheel 10. The second gear wheel 11 rotates about a second gear wheel axis 110 which is arranged parallel and offset in relation to the shaft axis 140 and is fixed in space. The rotational movement of the shaft 14 is therefore transmitted to the second gear wheel 11. The first and the second gear wheel 10, 11 are likewise formed by printed circuit boards 1, 101.

The number of teeth of the second gear wheel 11 is smaller than the number of teeth of the first gear wheel 10. The number of teeth of the first gear wheel 10 is not an integer multiple of the number of teeth of the second gear wheel 11. In this case, the first gear wheel 10 preferably has at least 3 times more teeth than the second gear wheel 11, further preferably 4 times more teeth than the second gear wheel 11. The toothing 12, 13 of the two gear wheels 10, 11 is formed on the corresponding printed circuit board. The two gear wheels 10, 11 are therefore in contact by means of the printed circuit boards.

The rotations of the first and of the second gear wheel 10, 11 are measured by means of a sensor 150 and the signals further to a control unit 15 which can determine from said signals an absolute rotation state, in particular a rotation angle of the shaft 14.

Figure 3:
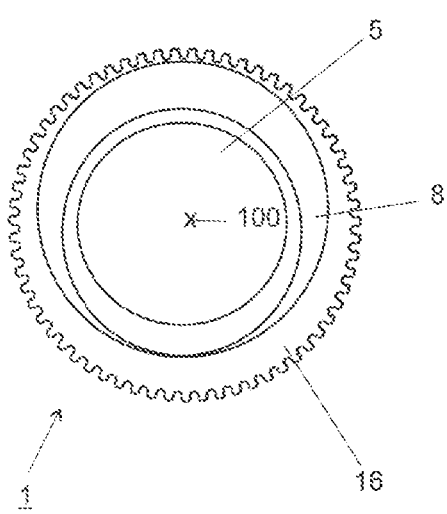
FIG. 3 is a plan view of an example printed circuit board.

FIG. 3 illustrates a gear wheel 16 which forms a printed circuit board. The gear wheel 16 carries the above-described track 8. The two gear wheels of the sensor unit 9 illustrated in FIG. 2 are preferably designed so as to allow absolute determination of the rotation angle of the shaft 14.

Figure 4:
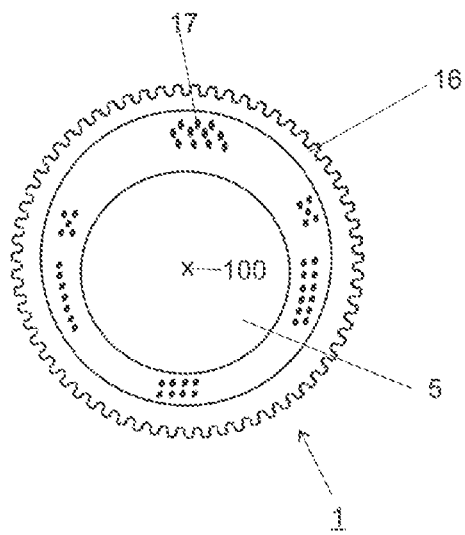
FIG. 4 is a plan view of an example printed circuit board with an additional surface structure.

FIG. 4 shows that the gear wheel 16 can have, in addition to the track 8, a surface structure 17 by means of which the rotation state of a shaft can be detected more accurately.

Figure 5:
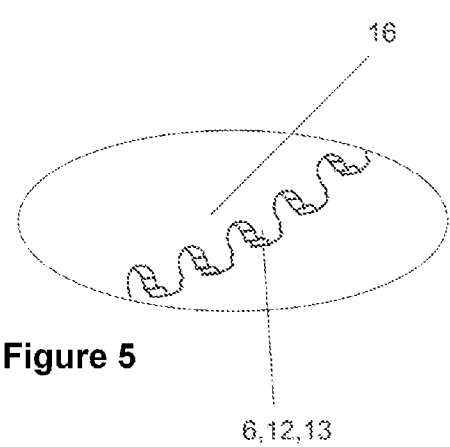
FIG. 5 is a detail view of an example toothing of a printed circuit board.
Figure 6:
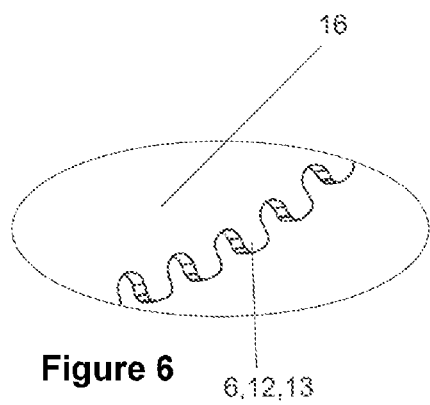
FIG. 6 is a detail view of another example toothing of a printed circuit board.

FIGS. 5 and 6 illustrate two exemplary toothings of a gear wheel 7, 10, 11, 16 which is designed as a printed circuit board. The toothing can be designed, as illustrated in FIG. 5, as a lantern gear toothing or as an involute, epicycloid or hypocycloid toothing. The toothing can be configured in an axially parallel or oblique manner or as an arcuate toothing. Furthermore, it is conceivable and possible for the teeth to be designed as a Maltese cross.

Figure 7:
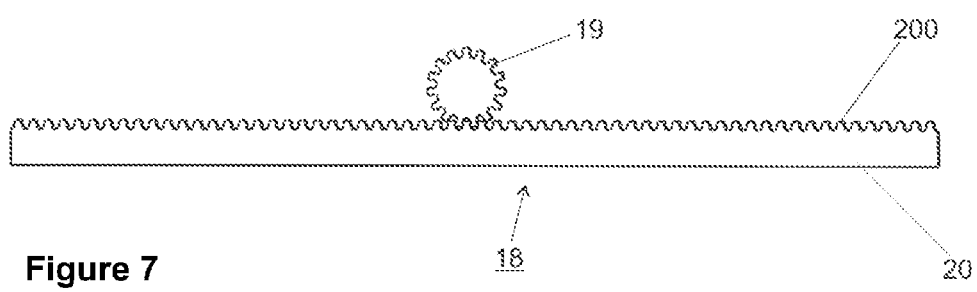
FIG. 7 is a schematic view of an example rack-and-pinion gear mechanism with a toothed printed circuit board.

FIG. 7 illustrates a linear design of the sensor arrangement in the form of a rack-and-pinion gear mechanism 18, in which a gear wheel 19 which is designed as a printed circuit board rolls on a toothing 200 of a rack and pinion 20 and therefore can convert the rotation of the gear wheel 19 into a linear movement of the rack and pinion, and vice versa. A sensor unit, not illustrated, measures the rotation of the gear wheel 19 in the process.

What is claimed is:

1. A printed circuit board comprising:
a top side;
a bottom side;
a circumferential surface that connects the top side to the bottom side, wherein the circumferential surface includes a toothing that forms a gear wheel; and
at least one of a track, a surface structure, or a conductor track configured for at least one of inductive sampling, capacitive sampling, optical sampling, or acoustic sampling, wherein the at least one of a track, a surface structure, or a conductor track is a circular and non-uniform.

2. The printed circuit board of claim 1 wherein the toothing is circumferentially closed and disposed over an entire surface area of the circumferential surface.

3. The printed circuit board of claim 1 wherein the toothing is configured as an involute toothing, an epicycloid toothing, a hypocycloid toothing, or a lantern gear toothing.

4. The printed circuit board of claim 3 wherein the gear wheel is configured as a Maltese cross.

5. The printed circuit board of claim 1 comprising at least one of an electrical resistor, a capacitor, a diode, or a transistor.

6. The printed circuit board of claim 1 comprised of fiber-reinforced plastic.

7. The printed circuit board of claim 1 wherein at least one of the gear wheel or the toothing includes a surface structure.

8. The printed circuit board of claim 1 comprising the track or the surface structure, wherein the track is comprised of projections and recesses, wherein the surface structure is comprised of projections and recesses.

9. The printed circuit board of claim 1 comprising a coating that includes at least one of $MoS_2$, PTFE, graphite, or UEMWPE.

10. The printed circuit board of claim 9 wherein the coating is disposed on the toothing.

11. The printed circuit board of claim 1 wherein the circumferential surface and the toothing are disposed on a radially outer periphery of the printed circuit board.

12. A sensor unit comprising the printed circuit board of claim 1.

13. A method for producing a printed circuit board with a top side, a bottom side, and a circumferential surface that connects the top side to the bottom side, wherein the method comprises:
forming a toothing on the circumferential surface of the printed circuit board; and
forming at least one of a track, a surface structure, or a conductor track configured, wherein the at least one of a track, a surface structure, or a conductor track is a circular and non-uniform.

14. The method of claim 13 wherein forming the toothing on the circumferential surface is performed by milling.

15. The method of claim 13 wherein forming the toothing on the circumferential surface is performed by punching.

16. The method of claim 13 wherein forming the toothing on the circumferential surface is performed by laser cutting.

17. The method of claim 13 wherein the toothing is formed circumferentially closed over an entire surface area of the circumferential surface.

18. The method of claim 13 wherein the toothing is an involute toothing, an epicycloid toothing, a hypocycloid toothing, or a lantern gear toothing.

* * * * *